United States Patent
Levitt et al.

(10) Patent No.: US 6,501,258 B1
(45) Date of Patent: Dec. 31, 2002

(54) OPTICAL SPATIAL FREQUENCY MEASUREMENT

(75) Inventors: Hal L Levitt, Baltimore, MD (US); Sokhom Kith, Fairfax, VA (US); Dale L. Reynolds, Elizabeth, CO (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/965,249

(22) Filed: Sep. 28, 2001

(51) Int. Cl.[7] ............................................. G01R 23/17
(52) U.S. Cl. ............................. 324/76.37; 324/76.36; 356/347; 356/345
(58) Field of Search .................... 324/76.37, 76.36, 324/76.27–76.35; 359/191, 305, 310; 356/303, 450, 345, 346, 347; 375/130, 140, 316

(56) References Cited

U.S. PATENT DOCUMENTS

| | | | |
|---|---|---|---|
| 4,612,545 A | | 9/1986 | Asendorf et al. ......... 343/18 E |
| 5,105,380 A | * | 4/1992 | Owechko ..................... 364/825 |
| 5,396,507 A | | 3/1995 | Kaminow et al. ............ 372/20 |
| 5,524,014 A | | 6/1996 | Kaminow et al. ............ 372/28 |
| 5,682,238 A | | 10/1997 | Levitt et al. ............. 324/76.37 |
| 5,995,524 A | | 11/1999 | Monnard ..................... 372/28 |
| 6,186,937 B1 | | 2/2001 | Ackerman et al. .......... 506/352 |

OTHER PUBLICATIONS

Polkinghorn, Farnham, Ambiguity Resolution in the SPA-SUR Radio Interferometer Direction Finding System, Naval Research Laboratory Report 6603, Oct. 12, 1967.
TSUI, Microwave Receivers with Electronics Warfare Applications, John Wiley & Sons, 1986, pp. 233–235.

* cited by examiner

*Primary Examiner*—Christine Oda
*Assistant Examiner*—Amy He
(74) *Attorney, Agent, or Firm*—John J. Karasek; L. George Legg

(57) ABSTRACT

A signal processing apparatus for providing electrical frequency measurements of input signals. In one embodiment, a power splitter divides an RF input signal into first and second input signals. An RF channelizer having a filter bank receives the first input signal and determines a coarse frequency measurement. An optical modulator modulates an optical carrier signal with the second input signal, and a beam splitter divides the modulated carrier signal into a plurality of optical signals that each feed into one of a plurality of optical frequency discriminators ("OFD"). Each OFD uses a fiber optic delay line and spatial domain sampling techniques to extract a phase measurement. An ambiguity resolver receives the phase measurement from each OFD and determines a single, absolute phase measurement, which is translated to a fine frequency measurement. A frequency encoder combines the coarse and fine frequency measurements to produce a final frequency measurement having increased resolution.

15 Claims, 7 Drawing Sheets

OPTICAL SPATIAL FREQUENCY MEASUREMENT

BACKGROUND OF THE INVENTION

1. Field of the Invention

The present invention is directed to electrical frequency measurement, and particularly to a signal processing apparatus for providing accurate temporal frequency measurement of radio frequency ("RF") input signals over a wide instantaneous bandwidth and dynamic range.

2. Description of the Related Art

Electrical frequency measurement is a requirement for numerous signal processing, communication, and signal measurement systems in use today and in the foreseeable future. A wide instantaneous operating bandwidth is necessary in many such systems. Frequency is a key measurement parameter for the purpose of signal tracking, characterization, and identification in systems such as satellite and terrestrial communications systems, radar receivers, and RF test equipment. Frequency is one of the most useful parameters to differentiate between signals and to specifically identify a type of radar threat.

Present approaches to frequency measurement include frequency discriminator and instantaneous frequency measurement ("IFM") devices for which the measured frequency accuracy is generally more sensitive to input signal strength variations. For example, most frequency discriminators operate within a limited internal input signal dynamic range, typically within the saturation region, and hence require additional circuits to constrain input signals to this region. For this reason these devices are unable to resolve pulse-on-pulse or pulse-on-continuous wave ("CW") signal conditions well.

A U.S. patent of interest includes U.S. Pat. No. 5,682,238 to Levitt et al. (the subject matter of which is incorporated herein by reference), which discloses a signal processing apparatus with an optical phase measurement processor that provides phase difference measurements of multiple signal inputs.

SUMMARY OF THE INVENTION

The present invention relates to a signal processing apparatus and method that provide accurate temporal frequency measurement of RF input signals within a wide instantaneous input bandwidth and dynamic range. Instantaneous RF frequency measurement is accomplished using a hybrid optical/electronic processing architecture based on an optical frequency discriminator component and an associated spatial-domain phase measurement technique. An example of an efficient spatial sampling scheme for electrical phase measurement is described in the '238 patent.

In the present invention, signal inputs of interest are individually detected, with concurrent frequency and possibly other time-domain parameter measurements, in sequence of occurrence. While optimized for sequential or "single-signal-at-a-time" processing, the present invention also has the capability to process pulse-on-pulse inputs (e.g., pulse-modulated RF signals overlapped in time, but having different pulse start times) and pulse-on-CW background interference.

Basic frequency measurement occurs through two concurrent processes, (1) detection of signal presence with coarse frequency measurement, and (2) fine frequency measurement. Detection and coarse frequency measurement (i.e., a coarse indication of frequency subband) are accomplished using a conventional RF filter bank and detection circuit techniques. Fine frequency measurement incorporates a plurality of single channel frequency-to-phase translators, each having the form of an optical delay line frequency discriminator for which the resulting phase variation is encoded by an efficient optical spatial sampling technique. In a preferred embodiment, the translators are implemented in a suitable configuration, complemented with algorithms to extract phase measurements of individual translator elements and resolve circular phase ambiguities. The basic phase difference measurement element and decoding algorithm are realized as a single channel version of the apparatus described in the '238 patent.

The multiple frequency discriminator outputs are applied to an ambiguity resolution algorithm to determine a unique (unambiguous) frequency measurement within a subband, and provide fine frequency resolution equivalent to the discriminator with maximum time delay. Frequency ambiguity resolution is accomplished with algorithmic methods similar to those employed by RF interferometers to resolve angle of arrival ambiguity. The encoded filter bank subband, in conjunction with fine frequency discriminator bank output, permits frequency measurement coverage of the entire system bandwidth.

Relative to commercial electronic frequency discriminator and instantaneous frequency measurement devices that incorporate fixed calibration techniques, the present invention provides improved and sustainable frequency measurement accuracy across the entire operating bandwidth and temperature range through continuous dynamic phase offset correction. Wide instantaneous RF bandwidth operation is achieved using developed optical modulation devices and RF filter bank technology to match or exceed available alternatives. Additionally, current frequency discriminator and IFM devices must function (internally) over a limited amplitude dynamic range to achieve acceptable measurement accuracy. The present invention functions correctly over a much wider dynamic range, limited only by noise and photodetector saturation. This feature may extend the achievable system-level dynamic range and/or simplify the system architecture by eliminating the requirement for saturated (or limited) mode operation, both results being advantageous in terms of system cost and complexity.

The present invention may be applicable to any receiver system that requires frequency measurement over a wide instantaneous bandwidth, such as electronic warfare ("EW") receivers, electronic counter measures, radar warning receivers ("RWR"), shipboard electronic support measures ("ESM"), unmanned aerial vehicles, and to direct broadcast satellite, cellular telephone, wireless LAN, and test and evaluation equipment. Frequency spectrum monitoring agencies may also find useful application of the present invention to enforce proper usage of the local RF spectrum.

These, together with other advantages that will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1:
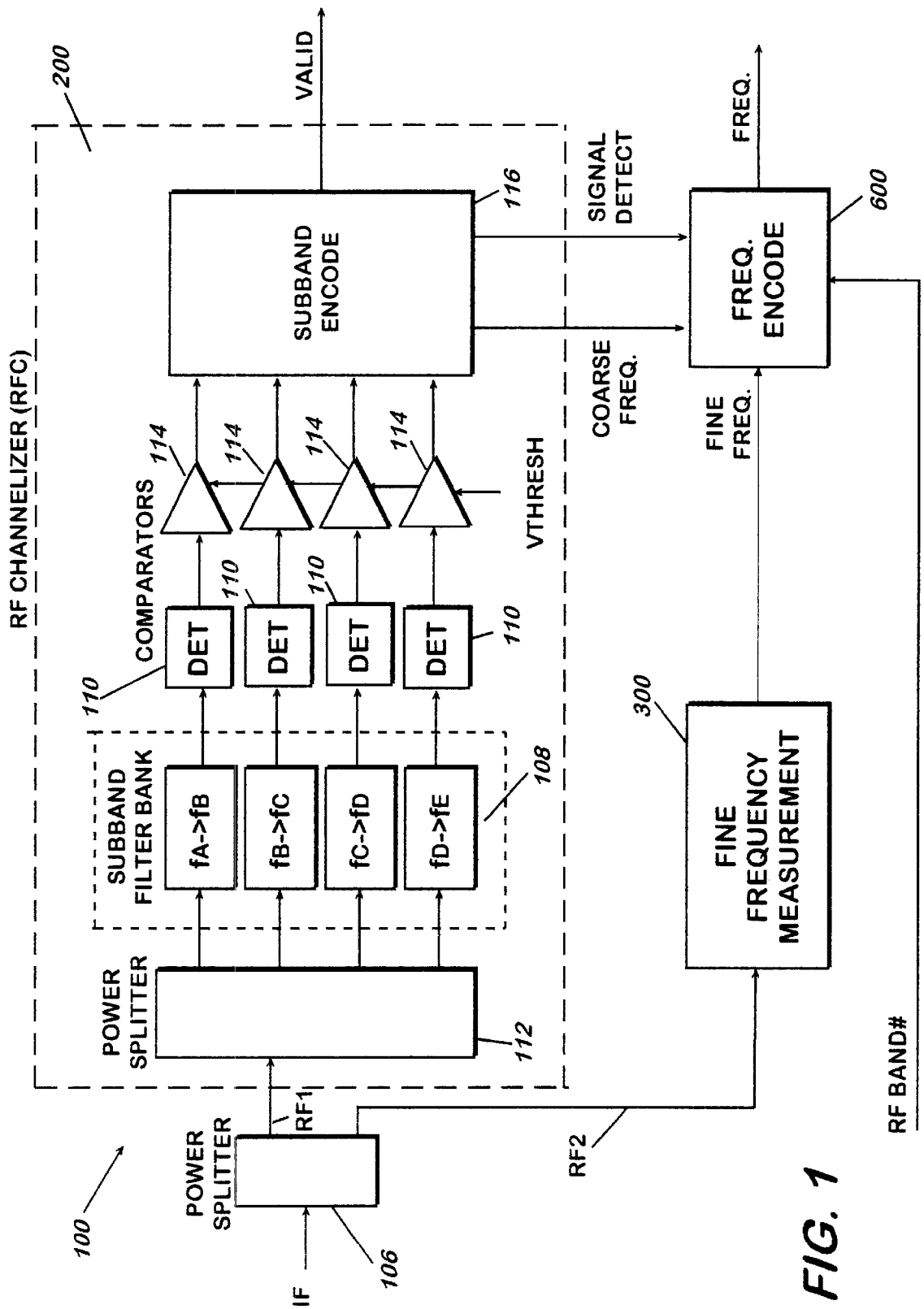
FIG. 1 is a schematic block diagram of a preferred embodiment of the optical spatial frequency measurement apparatus of the present invention.

FIG. 1 illustrates a schematic block diagram of a preferred embodiment of the present invention, which is an optical spatial frequency measurement (OSFM) apparatus 100. In FIG. 1, an RF input signal, for which frequency is to be measured, is divided into two identical wideband input signals RF1 and RF2, which travel along separate paths, by a conventional RF power splitter 106. Input signal RF1 is sent to a channelized frequency measurement device and is used for signal detection and coarse frequency measurement. In the embodiment shown in FIG. 1, the channelized frequency measurement device is an RF channelizer (RFC) 200. Input signal RF2 is sent to an optical fine frequency measurement ("FFM") module 300 for fine frequency measurement. The two frequency measurement processes take place concurrently.

The bandwidth of the input signal is typically greater than 500 MHz. The input signal may originate from a much higher microwave frequency signal that is frequency downconverted to an intermediate frequency ("IF") signal in, for example, a 1–5 GHz range. Alternatively, other types of input signals may be used, such as sound, heat, light, electrical voltage, or any other measurable quantity as long as the applied input signal modulates or otherwise alters a carrier signal to incur a frequency offset.

Referring to the upper portion of FIG. 1, coarse frequency is measured within the RFC 200. The input signal is divided into separate frequency subbands by multiplexing the signal, or more typically, by using a filter bank 108 of RF bandpass filters. Signal activity detectors 110 are attached to the outputs of each bandpass filter comprising the filter bank 108. The individual filters are treated as "brick wall filters" in that they are assumed to be essentially non-overlapping in frequency and to function independently, with the signal being detected in only one filter. This technique, described in the '238 patent, divides the composite input bandwidth into consecutive subbands constituting the entire bandwidth, each subband having center frequency and passband corresponding to the individual filter characteristics.

A power splitter 112 equally divides the input signal RF1 power into a multitude of output paths, each driving individual filters in the filter bank 108. Each bandpass filter in the filter bank 108 is followed by processing circuitry comprising the signal activity detectors 110 and comparator subcircuits 114 for amplitude measurement. Each activity detector 110 functionally converts an incoming RF signal to detector video, followed by comparison in each comparator 114 to a selected reference threshold value (VThresh). When the signal level exceeds the threshold value, a binary output signal is generated indicating the presence of RF energy (or activity) within a respective subband.

A subband encoder circuit 116 processes the binary activity outputs of all subbands to produce a single binary encoded representation of the active channel (or filter) number as a coarse frequency value, resolving subband edge conflicts in the process. For example, given an RF input signal having a 2 GHz instantaneous bandwidth and 4 filters in the filter bank 108, each filter will comprise a 500 MHz bandwidth, and the subband encoder 116 will encode a frequency value accurate to within 500 MHz, assuming no interpolation is used. Then, the resolution within that 500 MHz bandwidth is determined by the FFM module 300. If the input signal is detected in more than one filter, the subband encoder 116 in the RFC 200 may determine which filter has the stronger signal, by for example, using actual amplitude levels, or interpolating a coarse frequency value that is more accurate than the filter coarse bandwidth itself.

Thus, given an input bandwidth containing a single input frequency signal, the RFC 200 will provide as output the encoded channel number corresponding to a subband filter in which the input signal frequency lies, in addition to a VALID or signal detect binary level signal, to initiate frequency measurement readout, to a frequency encoder 600 (described below).

Alternative implementations of RFC 200 functionality are also possible using digital techniques. One example is to sample and digitize the incident downconverted RF and apply the digitized samples to a Fast Fourier Transform (FFT) to produce coarse frequency measurement channel outputs. Digital thresholding and subband encoding would follow to produce the requisite RFC output. Also note that subsequent to production of digital samples, the processing may be implemented by hardware, software, or hybrid means to produce the desired RFC function.

Coherent or incoherent signal detection may be used in the present invention. Incoherent or power detection simplifies subsequent signal processing hardware requirements, operating at relatively narrow video bandwidth. In contrast, coherent or heterodyne detection requires more complex processing hardware operating at intermediate frequencies, but, in principle, can achieve a larger dynamic range. A typical coherent approach requires carrier mixing and filtering operations to convert the RF input to a corresponding IF signal, which must then be time-domain processed to measure frequency. The preferred embodiment uses incoherent non-synchronous signal detection methods to illustrate a relatively simple and low cost means of frequency measurement.

Figure 2:
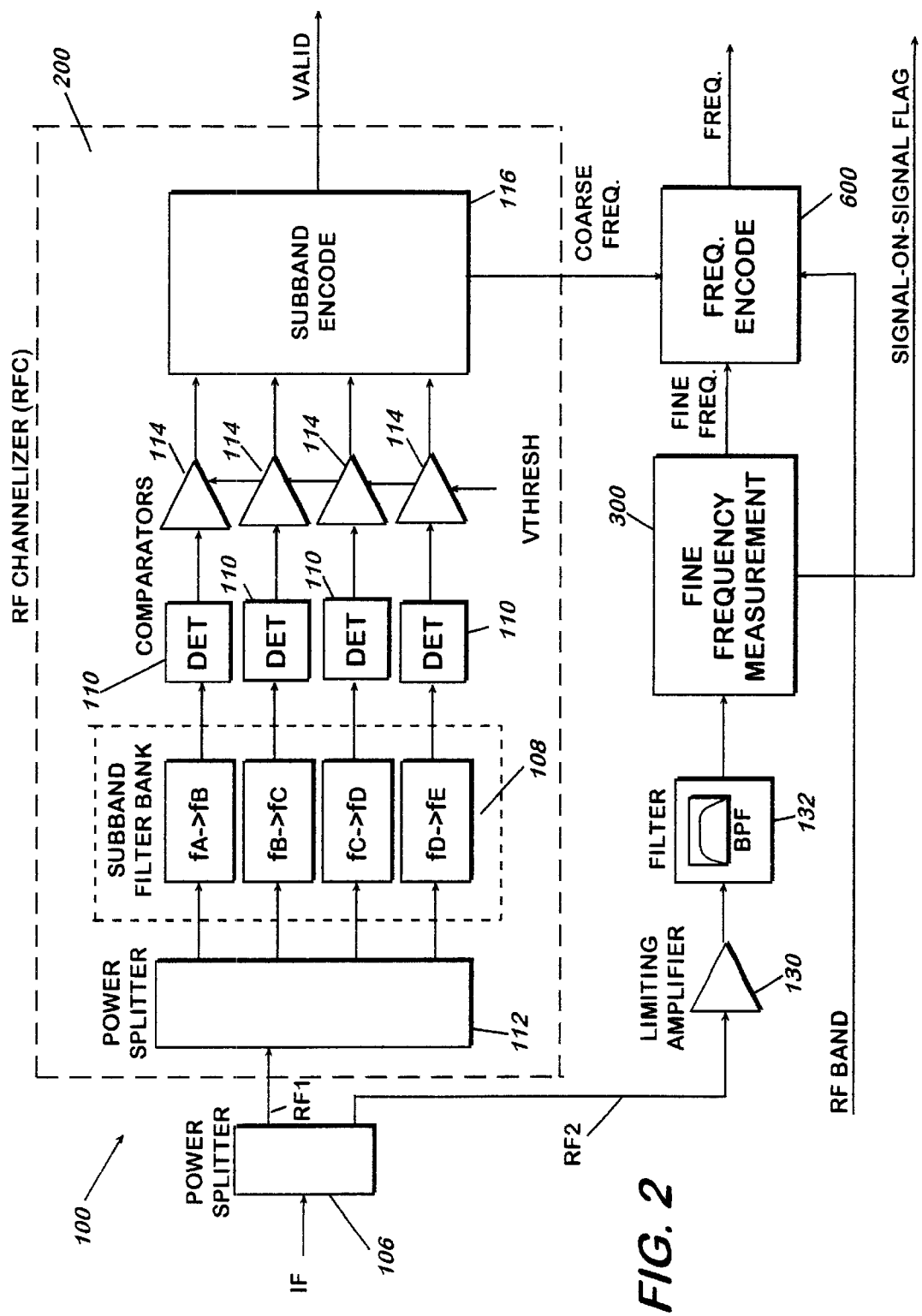
FIG. 2 is a schematic block diagram of an alternative embodiment of the optical spatial frequency measurement apparatus of the present invention.

Input signal RF2 is sent to the FFM module 300, which concurrently provides fine frequency measurement. Prior to FFM module 300 processing, an optional saturating amplifier 130, as shown in FIG. 2, may be used in systems requiring an operational dynamic range exceeding that of the FFM module 300 alone, or where maximum measurement accuracy is desired. In this case, the saturating amplifier 130 raises input signal levels to the amplifier saturation point where limiting takes place for part or all of the input dynamic range. Due to an inherent amplifier "capture" effect, other weaker signals and internally generated spurious RF are inhibited and thus do not greatly affect the measurement. The saturating amplifier 130 may be necessary in multiple signal conditions when it is intended to capture only one signal by saturating the input signal as a means for signal-to-signal measurement over a wider dynamic range. An optional bandpass filter 132 eliminates out-of-band frequency components caused by signal modulation and non-linear operation of the saturating amplifier 130.

The FFM module 300 in FIG. 2 is enhanced to permit detection of signal-on-signal transitions, to select valid single signal measurements, and provide an indication of invalid multiple overlapped signal measurement conditions.

Figure 3:
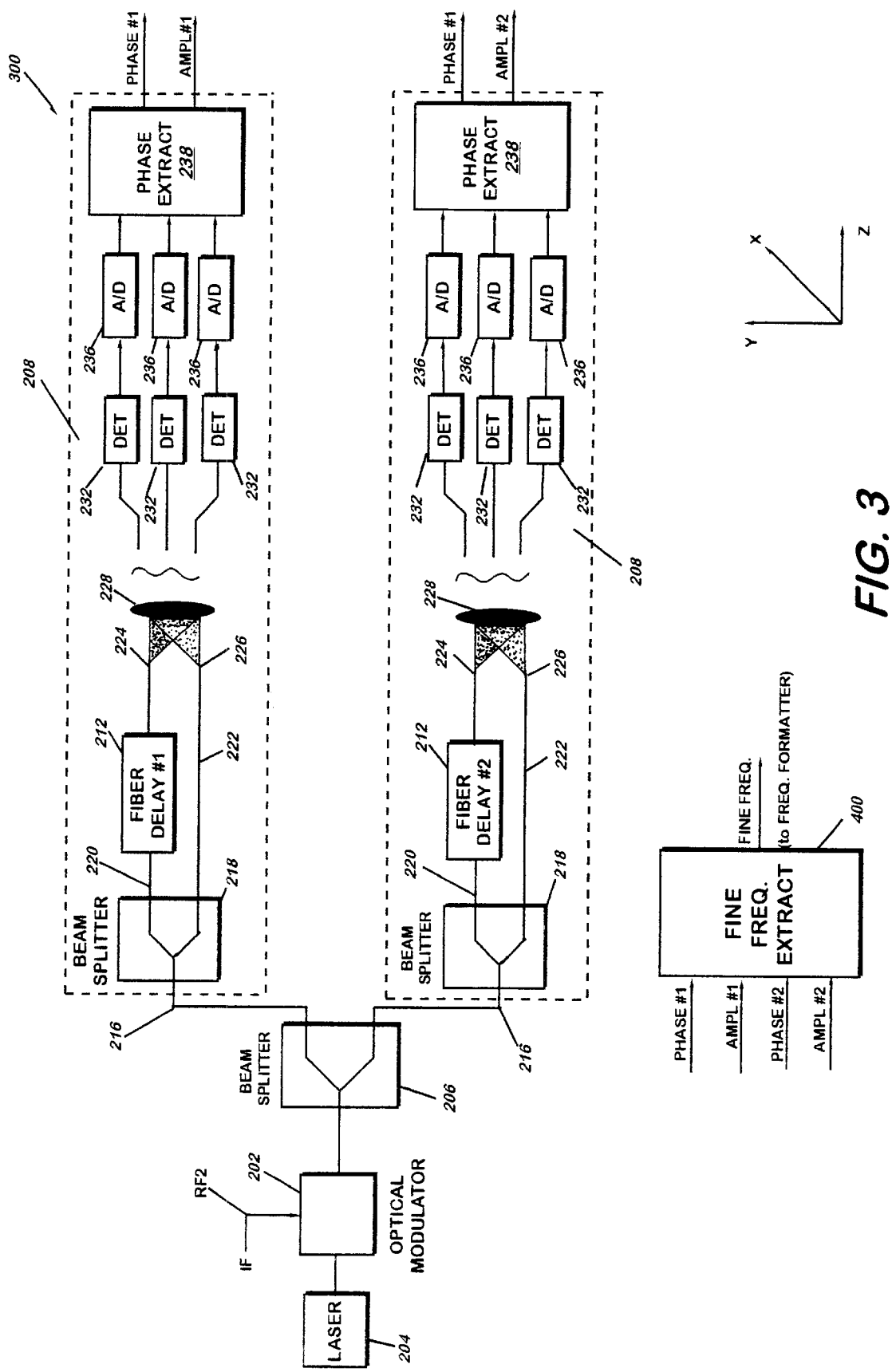
FIG. 3 is a schematic block diagram of the optical fine frequency measurement module of FIG. 1 of the present invention.

FIG. 3 illustrates fine frequency measurement in the FFM module 300. Input signal RF2 drives an optical modulator 202, which imposes the RF signal frequency onto the input optical source, laser 204, using either amplitude or phase modulation techniques. Although an optical carrier is used in the preferred embodiment, the carrier may also be represented in other forms, such as radio waves or frequency spectral ranges, as well. Thus, for example, RF applications may use microwave or millimeter-wave bands, or optical applications operating at infrared or ultraviolet wavelengths. The optical modulator 202 may be either a single or double sideband optical modulator. In this process, the optical beam frequency is shifted by an amount equal to (or related to) the incident RF signal to be measured on one side of the optical carrier frequency.

An optical fiber beam splitter 206 separates the resulting modulated optical signal into multiple paths 216, each path feeding an optical frequency discriminator (OFD) module 208. Multiple OFD modules 208 are used to achieve a wide input bandwidth and fine frequency resolution simultaneously. Each OFD module 208 operates over the entire frequency range. The OFD modules 208 have differing delay line lengths corresponding to different frequency resolutions. Additionally, the delay line lengths are chosen such that processing of the composite of the OFD module 208 outputs resolves the circular phase ambiguity throughout the operating bandwidth, thereby achieving unambiguous phase, and hence frequency, measurement. If each filter of the filter bank 108 comprises 500 MHz, the number of OFD modules 208 and their spacings or delays would be such as to resolve the 500 MHz unambiguously to complete the frequency estimate.

Construction of the RFC 200 and the FFM module 300 can vary depending on the needs of the application. Choice of the number of filter bank 108 channels and OFD modules 208 are implementation-dependent factors, associated with performance requirements and cost. A tradeoff exists between the number of filter bank 108 filters and the number of OFD modules 208. For a given fine frequency resolution requirement, implementing more coarse filter bank 108 channels can reduce the number of OFD modules 208. Similarly, more OFD modules 208 can reduce the number of filter bank 108 channels. A balance is made so that an unambiguous frequency value is obtained as an end result. For example, for a 2 GHz bandwidth, 4 to 8 filters and 3 OFD modules 208 are representative.

The flexibility between the number of filter bank 108 filters and OFD modules 208 required to achieve a desired frequency measurement accuracy for a given RF bandwidth is advantageous to minimize system cost and/or optimize other implementation dependent factors. For example, although the preferred embodiment uses an RF channelizer 200 to obtain a coarse frequency measurement, the tradeoff between the number of filter bank 108 filters and the number of OFD modules 208 for a particular implementation may indicate that coarse and fine frequency measurement can be performed more advantageously using only OFD modules 208.

In the embodiment shown in FIG. 3, two OFD modules 208 are illustrated. The structure of each OFD module 208 is essentially identical, differing only in fiber delay lines 212, each providing a design-dependent delay time within its respective OFD module 208 substructure. Preferably, the delay values are determined as described in the '238 patent.

Within the OFD module 208, the RF modulated optical signal 216 arrives at a two-way optical beamsplitter 218, emerging along two separate fiber optic paths 220 and 222. The first signal along the first path 220 passes through a fiber delay line 212 and incurs an additional fixed time delay t1 relative to the second signal along the second path 222. The fixed time delay t1 induces a linear phase shift as a function of optical (and hence modulated RF) frequency in its signal path. In the embodiment shown in FIG. 3, the FFM module 300 contains multiple OFD modules 208 that operate in parallel. By incorporating an adjustable delay-line element, one or more OFD modules 208 may be configured to operate in a sequential or mixed sequential/parallel manner.

Thus, a phase difference exists between the two signals arriving at apertures 224 and 226. The optical beams then radiate through the aperture openings 224 and 226 and interfere spatially along one axis corresponding to the axis formed by a line drawn between the two radiating point apertures (i.e., the Y axis in FIG. 3). An optical Fourier transform resulting from a Fourier transform lens 228 is then imaged and projected upon a set of photodetectors 232, transducing the captured optical energy at each photodetector 232 into electrical current or voltage. Preferably, the photodetector 232 configuration, phase measurement process, and associated algorithms are used as described in the '238 patent. The '238 patent extracts phase and amplitude of multiple parallel frequency channels simultaneously. Thus, only the portion of the FFM module 300 performing the phase and amplitude measurement, on a single channel basis, is applicable to the OSFM 100. Therefore, a detailed description of the phase and amplitude measurement process need not be reproduced here.

An optimal set of three photodetectors 232 with a preferred spacing and size are sufficient to unambiguously measure electrical phase difference within a range of 360 degrees. Electrical phase measurement by optical spatial sampling is preferable because of its simplified implementation and inherently parallel operation. Spatial sampling within each OFD module 208 uses measurement of three photodetector 232 output levels, such as voltage levels, followed by application of a simple measurement algorithm to extract relative carrier phase. Use of three photodetectors 232 minimizes the required number of sampling elements, maximizes overall signal energy utilization, increases speed of operation, and results in a more compact implementation. Also, use of the three spatial sampling photodetectors 232 and the corresponding algorithm provide high measurement accuracy and built-in correction for photodetector amplitude offsets, which vary as a function of input carrier signal strength and photodetector mismatch. Use of fewer spatial sampling photodetectors 232 results in a higher speed and less complex (and hence more compact) implementation of the OSFM 100.

In the preferred embodiment of FIG. 3, analog-to-digital ("A/D") conversion circuits 236 encode the electrical output signals of the photodetectors 232 into a binary-encoded digital format for subsequent digital processing by phase extraction 238 electronics and algorithms. The phase extraction module 238 outputs the measured phase difference in binary format as PHASE #1 and PHASE #2, along with corresponding amplitudes. Preferably, phase extraction techniques are used as described in the '238 patent.

Figure 4:
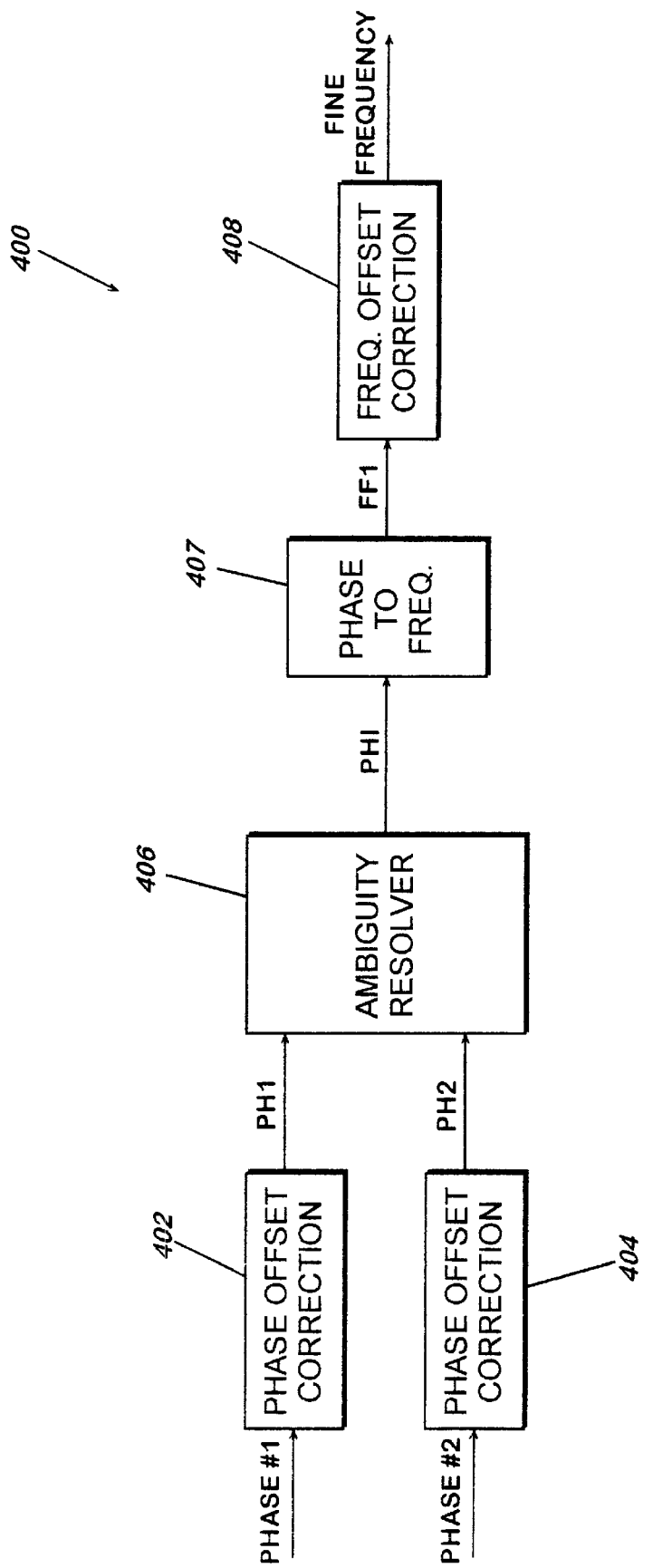
FIG. 4 is a flow diagram of fine frequency extraction processing within the fine frequency measurement module of FIG. 3.

In this way, each OFD module 208 provides an independent phase measurement representing the input RF frequency. Individual OFD module 208 phase outputs PHASE #1 and PHASE #2 and corresponding amplitudes are then fed into a fine frequency extraction module 400. Within the fine frequency extraction module 400, as shown in FIG. 4, the phase outputs PHASE #1 and PHASE #2 are fed into phase offset correction modules 402 and 404, where the measured phase is corrected for effective path length mismatch within each OFD 208, beamsplitter 206, and fiber paths 216. Additionally, phase offset corrections may be applied to map a reference phase value to each coarse channel center frequency of the RFC 100 in FIG. 1.

Phase offset correction may be necessary, particularly with optical fiber delay imbedded, because optical fibers are temperature-sensitive devices. Correction/tracking circuitry and algorithms are required to compensate for variations in fiber optic delay line length with ambient temperature. Optical fibers expand with temperature, causing a measurable path length difference as temperature varies. Thus, the delay will vary as a function of temperature. Also, the aging of components may necessitate phase correction. Dynamic phase offset correction may be accomplished by measuring phase when the signal is not present, by blanking the signal if necessary, or by other calibration techniques that can be used it the delay components or overall optical and electrical components are determined to be sensitive to age or temperature. If sensitive to temperature, then temperature is measured and correction is applied dynamically, simply through measurement of temperature without blanking inputs, to keep phase measurements accurate.

The corrected phases PH1 and PH2 are applied to the electronics and algorithms of an ambiguity resolver module 406. Preferably, the ambiguity resolver as described in the '238 patent is used. The ambiguity resolver module 406 resolves phase ambiguity across the inputs to determine a single, unambiguous, absolute phase measurement. Phase offset correction permits dynamic compensation of phase offsets between OFD modules 208, and within a single OFD module, which are caused by fixed component mismatches and changes over temperature and operating life. Ambiguity resolution is accomplished with algorithmic methods similar to those used by RF interferometers to resolve angle of arrival ambiguity, such as described in-the '238 patent. The absolute measured phase difference PHI is then transformed by phase-to-fine frequency converter ("PFFC") 407 to a measured fine frequency shift (in Hertz) from an arbitrary reference, as given by the following equation:

$$\Delta F \cong \frac{\Delta \theta}{T \cdot 360} \quad (1)$$

where,
  $\Delta\theta$=delta phase (degrees),
  T=time delay (secs),
  360=conversion constant (degrees/cycle).

Uncorrected frequency measurement data FF1 from the PFFC 407 are then applied to an optional frequency offset correction module 408 to remove any remaining frequency bias, producing a fine frequency offset that is fed to the frequency encoder 600.

Figure 5:
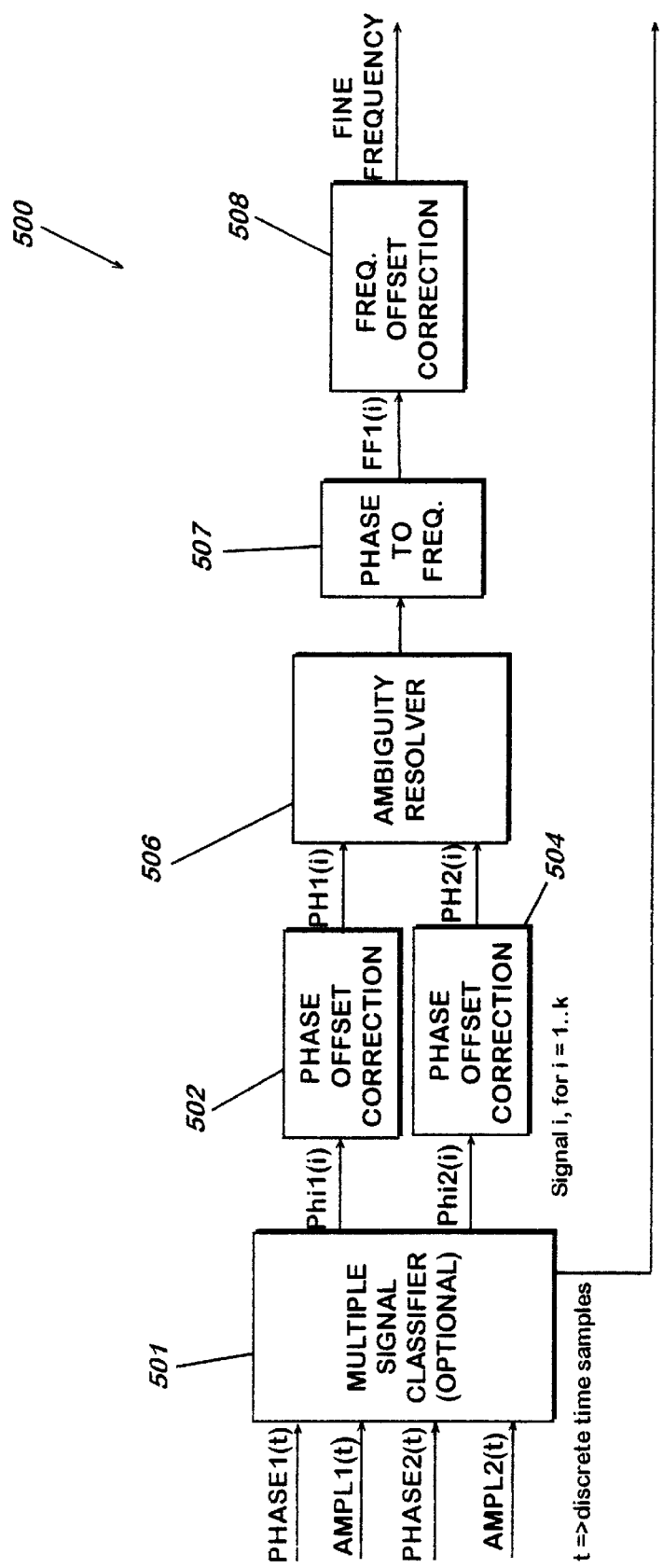
FIG. 5 is an alternative flow diagram of fine frequency extraction processing within the fine frequency measurement module of FIG. 3.

While the OSFM 100 is optimized for single-signal-at-a-time processing, the capability exists to process time concurrent pulse-on-pulse inputs and pulse-on-CW signal conditions. A fine frequency extraction module 500 is illustrated in FIG. 5 for multiple time-concurrent signal-on-signal processing. In FIG. 5, the multiple signal classifier ("MSC") 501, employs adaptive thresholding techniques to permit detection of a step-like increase in measurement signal amplitude that typically corresponds with appearance of a second signal pulse overlapping the preexisting (e.g., CW or pulse modulated) signal in time. The general concept and methods of adaptive thresholding in signal detection are documented in the prior art, particularly in the area of Electronic Warfare receiver design. Conceptually, the MSC 501 incorporates a delay or storage element and a comparator element to process the incident amplitude signal sequence developed from each OFM 208 module of FIG. 3. The comparator compares the current amplitude measurement to prior measurements to identify an amplitude transition corresponding to the signal-on-signal condition. Leading and/or trailing amplitude transitions can be detected in this way. The useful purpose achieved by the MSC 501 functionality is to select valid single signal measurements for further processing and provide indication of invalid signal-on-signal conditions.

A single coherent laser source 204 and optical modulator 202 can feed multiple OFD modules 208 through the use of inexpensive fiber optic beamsplitters 206, for example. This permits reuse of the primary cost components while insuring identical RF modulated optical beam parameters at each OFD module 208 input. A physical size reduction is achieved through use of fiber optic delay lines 212 in comparison to conventional RF counterparts. The choice of a dynamic calibration scheme for phase offset correction and temperature compensation can significantly reduce individual component tolerance requirements and hence cost of the laser 204, the optical modulator 202, and the OFD modules 208.

Figure 6:
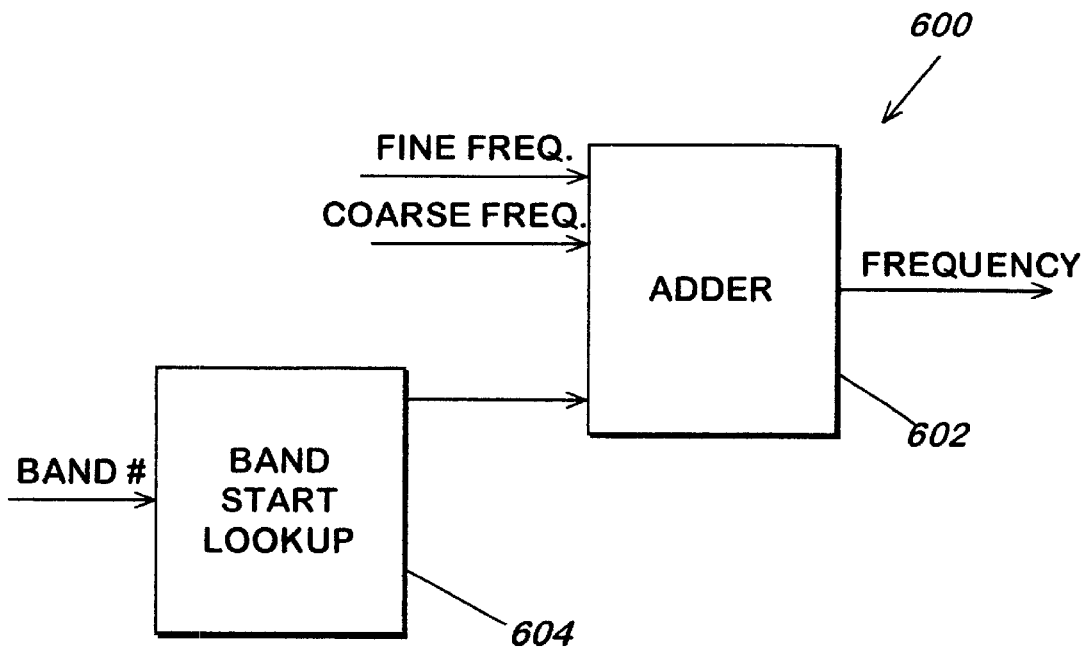
FIG. 6 is a flow diagram of processing within the frequency encoder module of FIG. 1 of the present invention.

FIG. 6 illustrates the frequency encoder 600. The frequency encoder 600 combines the fine frequency offset from the FFM module 300 with the coarse frequency estimate from the RFC 200 to produce a composite frequency value (in binary format), which is the desired output from the OSFM 100 apparatus. The frequency encoder 600 provides the proper combining and encoding algorithm, which can be as simple as appending or adding the fine frequency binary word to the coarse frequency binary value in an adder 602. Optionally, external RF conversion circuitry may provide an RF band number or index that can be applied to the adder 602 to provide an absolute frequency output. The RF band number is converted to a band start frequency utilizing a lookup table 604 to which a coarse frequency offset and a fine frequency offset may be added to provide the output frequency.

Detection of pulse-on-pulse and pulse-on-CW input conditions may optionally be implemented by oversampling in time within the RFC 200 and FFM module 300 to resolve signal leading edge transitions with additional processing. Dynamic phase offset calibration and thermal compensation, while not explicitly shown, are also implemented though oversampling in time. In this case, phase offsets are regularly updated during periods of "no signal present" conditions (or through RF input isolation means). This is accomplished using an internal calibrated RF source to inject RF pulses periodically, thereby maintaining frequency measurement accuracy.

Figure 7:
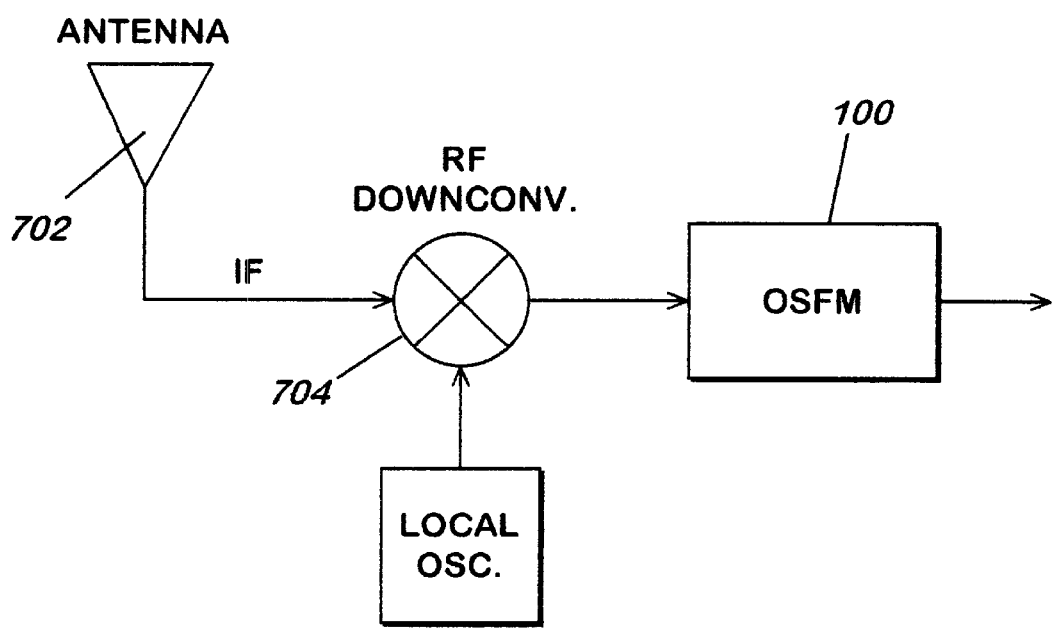
FIG. 7 is a schematic block diagram of the optical spatial frequency measurement apparatus of the present invention in an exemplary radio frequency measurement application.

FIG. 7 is a schematic block diagram of the OSFM apparatus 100 of the present invention in an exemplary RF receiver application. An incident RF bandwidth containing multiple input signals of interest propagating in free-space is acquired by a reception antenna 702. An RF downconverter 704 then frequency translates the RF bandwidth to an appropriate IF band for injection into the present invention (i.e., the OSFM) 100. The OSFM 100 then detects signal presence and measures signal parameters, primarily that of electrical frequency, for each signal in the active instantaneous IF bandwidth.

Figure 8:
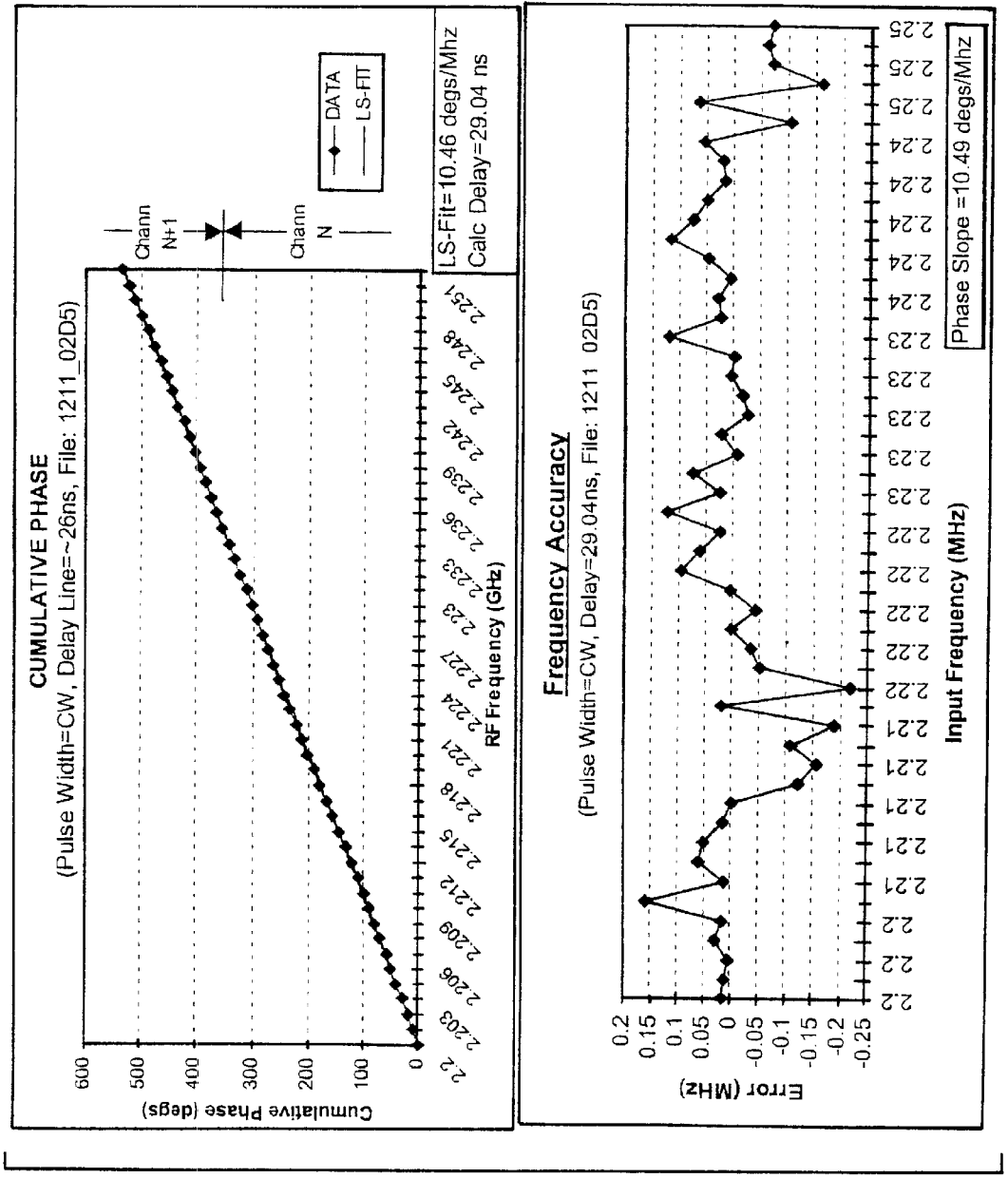
FIG. 8 is a graph of frequency measurement performance of the optical spatial frequency measurement apparatus of FIG. 1.

The present invention has been experimentally demonstrated for the preferred embodiment. FIG. 8 is a graph of cumulative phase and frequency accuracy measurements. Deviation from a linear fit is representative of calibrated frequency error. Using a 29.04 nanosecond delay line, measured frequency error was less than 0.25 MHz over a 34 MHz unambiguous range. Frequency measurement linearity with input frequency was verified over a 50 MHz range (one coarse channel) in 1 MHz steps. These results indicate the present invention is useful in numerous practical applications.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A signal processing apparatus for providing electrical frequency measurement of an input signal, comprising:
    a splitter dividing the input signal into a first input signal and a second input signal having a same frequency as the first input signal;
    a channelizer separating the first input signal into a plurality of frequency channels and determining a coarse frequency measurement corresponding to one of the frequency channels in which signal activity is detected;
    a fine frequency measurement unit receiving the second input signal, applying spatial domain sampling to extract a phase measurement, and converting the phase measurement to a fine frequency measurement; and
    a frequency encoder combining the coarse frequency measurement and the fine frequency measurement into an increased resolution frequency measurement.

2. The signal processing apparatus of claim 1, further comprising:
    a saturating amplifier receiving the second input signal before the fine frequency measurement unit receives the second input signal, the saturating amplifier raising a signal level of the second input signal to a saturation point of the saturating amplifier; and
    a bandpass filter receiving the second input signal with the raised signal level and outputting the second input signal with the raised signal level to the fine frequency measurement unit after removing out-of-band frequency components produced by the saturating amplifier.

3. The signal processing apparatus of claim 1, wherein the channelizer is an RF channelizer, comprising:
    a power splitter equally dividing the first input signal into a plurality of output signals;
    a filter bank having a plurality of filters, each filter receiving one of the output signals to divide the first input signal into separate frequency channels;
    a plurality of signal activity detectors, each signal activity detector receiving a signal from one of the filters and determining an amplitude of the signal from the respective filter;
    a plurality of comparators, each comparator receiving the amplitude from one of the signal activity detectors and generating an output signal indicating signal activity in a filter by determining whether the amplitude exceeds a predetermined reference threshold value; and
    a subband encoder receiving the output signals from the comparators and determining the coarse frequency corresponding to the filter having signal activity.

4. The signal processing apparatus of claim 1, wherein the fine frequency measurement unit comprises:
    a laser producing a carrier signal;
    an optical modulator receiving the carrier signal and the second input signal;
    a beam splitter dividing the modulated carrier signal into a plurality of optical signals;
    a plurality of optical frequency discriminators, each one of the optical frequency discriminators receiving one of the optical signals and generating a phase measurement; and
    a fine frequency extraction unit receiving each phase measurement and outputting the fine frequency measurement.

5. The signal processing apparatus of claim 4, wherein each one of the optical frequency discriminators comprises:
    a two-way beam splitter dividing the optical signal received into two signals that travel along two separate paths, one of the paths incurring a time delay relative to the second path, and the two signals interfering spatially to produce an intensity interference pattern;
    a plurality of photodetectors upon which the interference pattern is projected, the photodetectors producing electrical output signals; and
    a phase extraction unit receiving the electrical output signals and outputting the phase measurement.

6. The signal processing apparatus of claim 4, wherein the fine frequency extraction unit comprises:
    a plurality of phase offset correction units, each phase offset correction unit receiving one of the phase measurements and providing offset correction for the respective phase measurement;
    an ambiguity resolver receiving the offset corrected phase measurements, resolving phase ambiguity across the offset corrected phase measurements to generate a single unambiguous phase measurement; and
    a phase-to-frequency converter, transforming the single phase measurement to the fine frequency measurement.

7. The signal processing apparatus of claim 1, wherein the frequency encoder comprises:
    an RF band start lookup table providing a starting frequency for an RF band number provided from RF band conversion; and
    an adder that sums the coarse frequency measurement, the fine frequency measurement, and the starting frequency.

8. The signal processing apparatus of claim 1, further comprising:
    an antenna receiving the input signal propagating in free-space; and
    a downconverter receiving the input signal from the antenna and translating a frequency of the input signal to an intermediate frequency, and sending the downconverted input signal to the splitter.

9. A signal processing apparatus for providing electrical frequency measurement of an input signal, comprising:

an antenna receiving the input signal propagating in free-space;

a downconverter receiving the input signal from the antenna and translating a frequency of the input signal to an intermediate frequency;

a splitter dividing the downconverted input signal into a first input signal and a second input signal having a same frequency as the first input signal;

a channelizer separating the first input signal into a plurality of frequency channels and determining a coarse frequency measurement corresponding to one of the frequency channels in which signal activity is detected;

a fine frequency measurement unit receiving the second input signal, applying spatial domain sampling to extract a phase measurement, and converting the phase measurement to a fine frequency measurement; and a frequency encoder combining the coarse frequency measurement and the fine frequency measurement into an increased resolution frequency measurement.

10. A signal processing method for providing electrical frequency measurement of an input signal, comprising:

dividing the input signal into a first input signal and a second input signal having a same frequency as the first input signal;

determining a coarse frequency measurement by separating the first input signal into a plurality of frequency channels, the coarse frequency measurement corresponding to one of the frequency channels in which signal activity is detected;

determining a fine frequency measurement by applying spatial domain sampling to the second input signal to extract a phase measurement, and converting the phase measurement to the fine frequency measurement; and providing an increased resolution frequency measurement by combining the coarse frequency measurement and the fine frequency measurement.

11. The signal processing method of claim 10, further comprising:

raising a signal level of the second input signal to a saturation point before determining the fine frequency measurement; and determining the fine frequency measurement after removing out-of-band frequency components from the second input signal with the raised signal level.

12. The signal processing method of claim 10, wherein determining the coarse frequency measurement comprises:

dividing the first input signal into a plurality of channelized output signals and sending each output signal to a separate filter of a channelized filter bank;

determining a signal level of each channelized output signal;

comparing each signal level with a predetermined reference threshold value; and selecting the coarse frequency measurement corresponding to the strongest signal level that also exceeds the predetermined threshold value.

13. The signal processing method of claim 10, wherein determining the fine frequency measurement comprises:

producing an optical carrier signal;

modulating the optical carrier signal with the second input signal;

dividing the modulated carrier signal into a plurality of optical signals;

sending each one of the optical signals to one of a plurality of optical frequency discriminators;

generating a phase measurement for each optical frequency discriminator;

performing phase offset correction for each phase measurement;

resolving phase ambiguity across the offset corrected phase measurements to generate a single phase measurement, and transforming the single phase measurement to the fine frequency measurement.

14. The signal processing method of claim 13, wherein generating a phase measurement for each frequency discriminator comprises:

dividing each optical signal into two signals that travel along two separate paths, one of the paths incurring a time delay relative to the second path, and the two signals interfering spatially to produce an intensity interference pattern; and applying spatial domain sampling to the interference pattern to produce a phase measurement.

15. The signal processing method of claim 10, wherein providing an increased resolution frequency measurement comprises:

determining a starting frequency for an RF band number provided from RF band conversion; and summing the coarse frequency measurement, the fine frequency measurement, and the starting frequency.

* * * * *